United States Patent [19]

Liao

[11] Patent Number: 5,594,214

[45] Date of Patent: Jan. 14, 1997

[54] SIGNAL TRANSMISSION FLAT CABLE

[75] Inventor: Pin-Chien Liao, Taoyuan, Taiwan

[73] Assignee: Acer Peripherals, Inc., Taoyuan, Taiwan

[21] Appl. No.: 383,415

[22] Filed: Feb. 3, 1995

[51] Int. Cl.$^6$ ........................................... H01B 7/08
[52] U.S. Cl. ................. 174/117 F; 174/117 FF; 174/117 A
[58] Field of Search ................... 174/117 R, 117 F, 174/117 FF, 268, 117 A

[56] References Cited

U.S. PATENT DOCUMENTS

| | | | |
|---|---|---|---|
| 3,547,718 | 12/1970 | Gordon | 156/55 X |
| 3,876,964 | 4/1975 | Balaster et al. | 333/84 M X |
| 4,423,282 | 12/1983 | Suzuki et al. | 174/36 X |
| 4,616,102 | 10/1986 | Noorily | 174/36 X |
| 4,659,872 | 4/1987 | Dery et al. | 174/117 A |
| 4,783,579 | 11/1988 | Brandolf et al. | 174/117 FF |
| 5,389,741 | 2/1995 | Ueno | 174/117 F |

*Primary Examiner*—Kristine L. Kincaid
*Assistant Examiner*—Chau N. Nguyen
*Attorney, Agent, or Firm*—Fish & Richardson P.C.

[57] ABSTRACT

The signal transmission flat cable provided includes a first layer of substrate membrane, a second layer of a plurality of parallel traces for transmitting the signal, a third layer of finger array and a fourth layer of thin polyester membrane. The third layer of finger array covers the second layer. The fourth layer of thin polyester membrane is used to protect the second layer and third layer. The signal transmission flat cable is characterized in that the plurality of finger arrays are provided in the third layer at a plurality of predetermined locations along the flat cable and each of the plurality of finger arrays is spaced from each other by a given distance. A glue material is provided to bond the fourth layer and the second layer along the given distance. As a result, the flat cable has the module capability by which an user may cut away the excess portion of the flat cable depending on different requirement, such that the remaining portion of the flat cable may be inserted into the keyboard socket on the motherboard of a computer.

6 Claims, 5 Drawing Sheets

SIGNAL TRANSMISSION FLAT CABLE

TECHNICAL FIELD OF INVENTION

The invention relates to a signal transmission flat cable, and, in particular, to a flat cable having module capability.

BACKGROUND OF THE INVENTION

The signal transmission flat cable has been widely used in many data process products. For instance, in the notebook, palmtop or sub-notebook type computer system, signal transmission flat cable is used to connect the keyboard device with the motherboard of the system through a socket.

The arrangement of the location, orientation and the length of the flat cable connecting the keyboard is typically fixed and unalterable as shown in FIG. 1. In FIG. 1(A), the flat cable is fixedly located near the center axis of the keyboard and extends therefrom straightly. In FIG. 1(B), the flat cable is fixedly located near the left hand side of the keyboard and major length of the flat cable extends toward the right direction.

With the advent of the new technology or a demand for new motherboard of the system to down-size the notebook computer, the layout of the motherboard has been changed all the time. As a result, the location of the flat cable socket on the motherboard for the keyboard has to be changed. Therefore, the manufacture of the keyboard has to redesign the outlet location of the flat cable or the length of the flat cable to meet the change of the location of the flat cable socket on the motherboard.

SUMMARY OF THE INVENTION

It is therefore an object of the invention to provide a signal transmission flat cable having a module capability.

It is a further object of the invention to provide a signal transmission flat cable to versatilely meet the requirement of different location of the flat cable socket on the motherboard.

It is still anther object of the invention to provide a signal transmission flat cable having variable length capability.

The signal transmission flat cable provided comprises a first layer of substrate membrane, a second layer of a plurality of parallel traces for transmitting the signal, a third layer of finger array and a fourth layer of thin polyester membrane.

The third layer of finger array is covered on the second layer of parallel traces.

The fourth layer of thin polyester membrane is used to protect the second layer and third layer.

The signal transmission flat cable is characterized in that the plurality of finger arrays are provided in the third layer at a plurality of predetermined locations along the flat cable and each of the plurality of finger arrays is spaced from each other by a distance. A glue material is provided to bond the fourth layer and the second layer along the distance.

The advantage of the invention and further details of the invention will be apparent from the detailed description of the invention together with the appended drawings.

DETAILED DESCRIPTION OF THE INVENTION

Figure 1A:
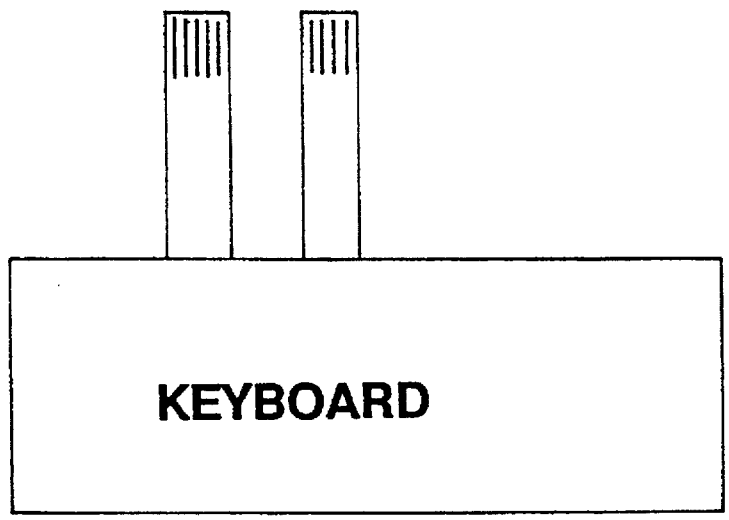
FIG. 1(A), 1(B) show the arrangement of the flat cable of the keyboard according to conventional approach.
Figure 1B:
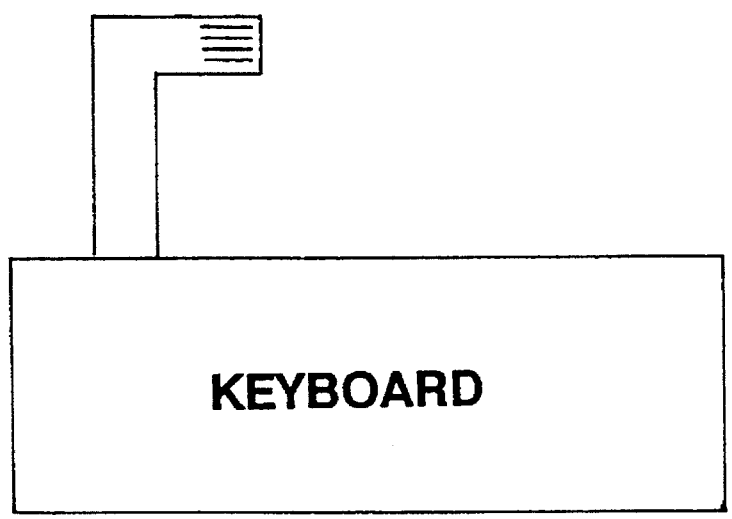
Figure 2A:
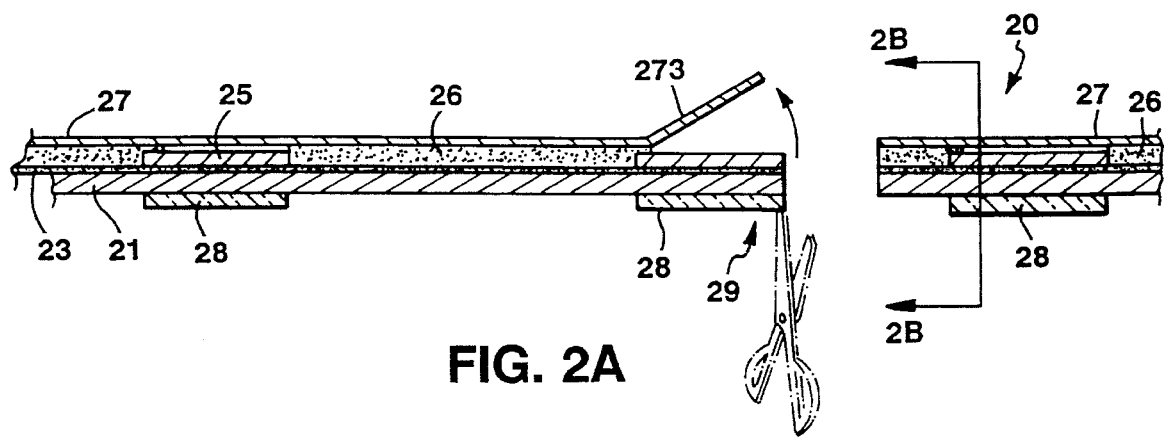
FIG. 2 shows the sectional views of the flat cable according to the first embodiment of the invention.

Referring to FIG. 2(A), the first embodiment of the invention, the signal transmission flat cable provided comprises a first layer of substrate membrane 21, a second layer of a plurality of parallel traces 23 for transmitting the signal, a third layer 25 of a plurality of finger arrays and a fourth layer 27 of thin polyester membrane.

The finger array 25 is formed by printing a paste material on the parallel traces 23. The paste material is obtained by mixing the carbon powder or graphite powder with dielectric resin by a well known manner.

The fourth layer 27 of thin polyester membrane is used to protect the third layer 25 and second layer 23 from electric contact with unexpected electric device. The well known Mylar®material may be used as the thin polyester membrane 27.

Figure 4A:
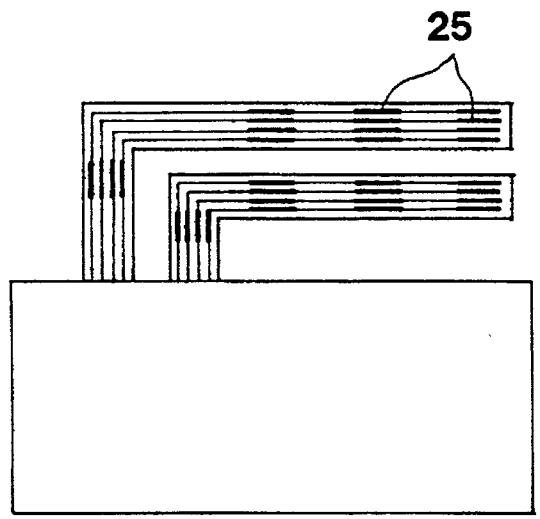
FIG. 4 (A), 4 (B), 4 (C) and 4 (D) respectively show the arrangement of the flat cable of the keyboard according to preferred embodiments of the invention.
Figure 4B:
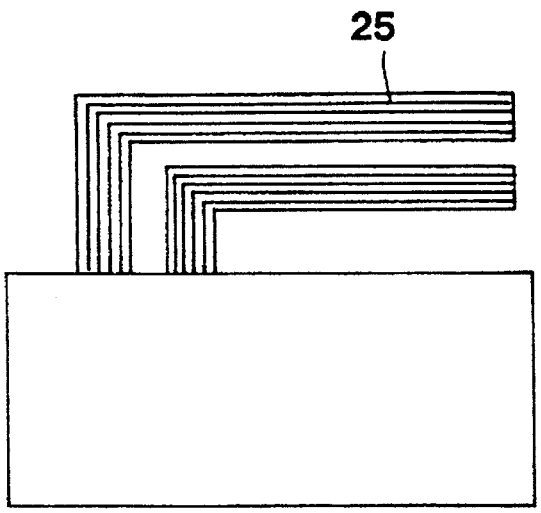
Figure 4D:
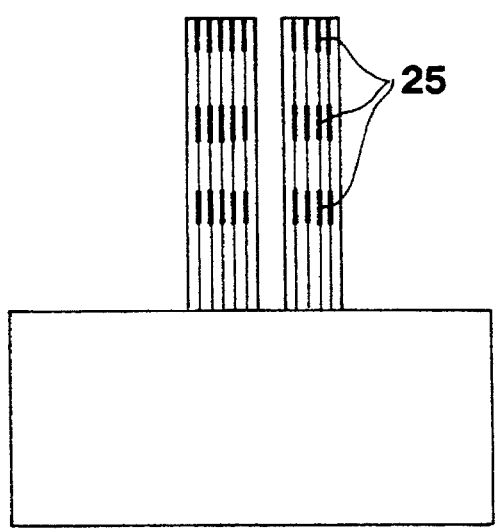

As shown in FIG. 2, FIG. 4(A) and FIG. 4(D), the signal transmission flat cable is characterized in that the plurality of finger arrays 25 are provided in the third layer at a plurality of predetermined locations along the flat cable and each of the plurality of finger arrays 25 is spaced from each other by a given distance. A glue material 26 is provided to bond the fourth layer 27 and the second layer 23 along the given distance.

Figure 4C:
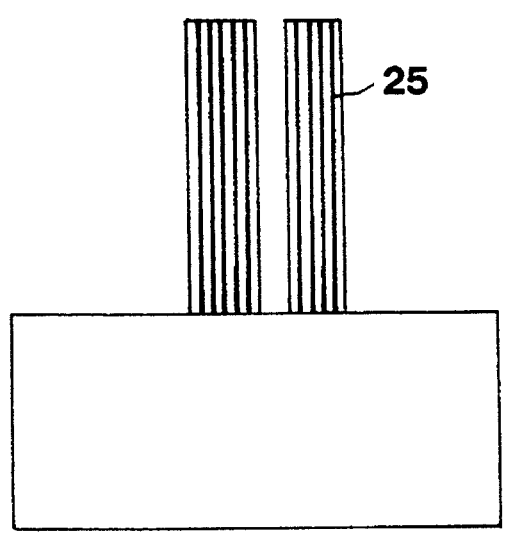
Figure 5:
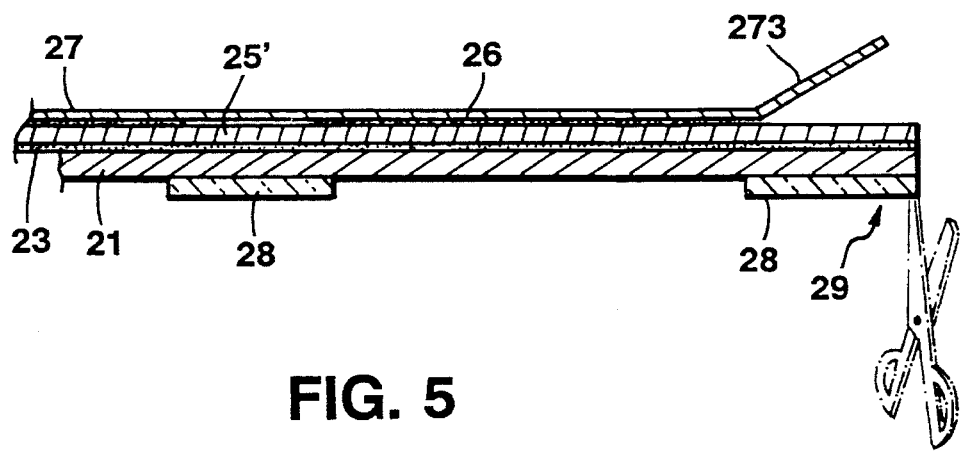
FIG. 5 shows the sectional view of a variant of the first embodiment.

In a variant, a finger array 25'is printed along the whole length of the flat cable, as shown in FIG. 4(B) FIG. 4(C) and FIG. 5. A glue material 26 is provided to bond the fourth layer 27 and the third layer 25' except at a plurality of predetermined regions.

Referring again to FIG. 2(A), before using the invention, the user (computer system manufacturer) first measures the adequate length of the flat cable suitable for insertion into the corresponding socket on the motherboard. Secondly, the user cuts away the excessive portion 20 of the flat cable. Thirdly, flip the portion 273 of the fourth layer 27 which does not have glue material 26 thereon as shown or, alternatively, cut away the portion 273 of the fourth layer 27. The end portion 29 then may be inserted into the corresponding socket on the motherboard.

Figure 2B:
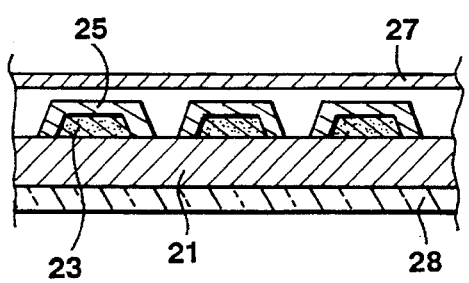

FIG. 2(B) is the enlargement view showing the finger array 25, parallel traces 23 and the substrate layer 21.

In order to increase the stiffness of the flat cable, a plurality of reinforced layers 28 are bonded to a bottom surface of the first layer 21 at the locations right under the finger arrays 25 as shown in FIG. 2(A).

Figure 3:
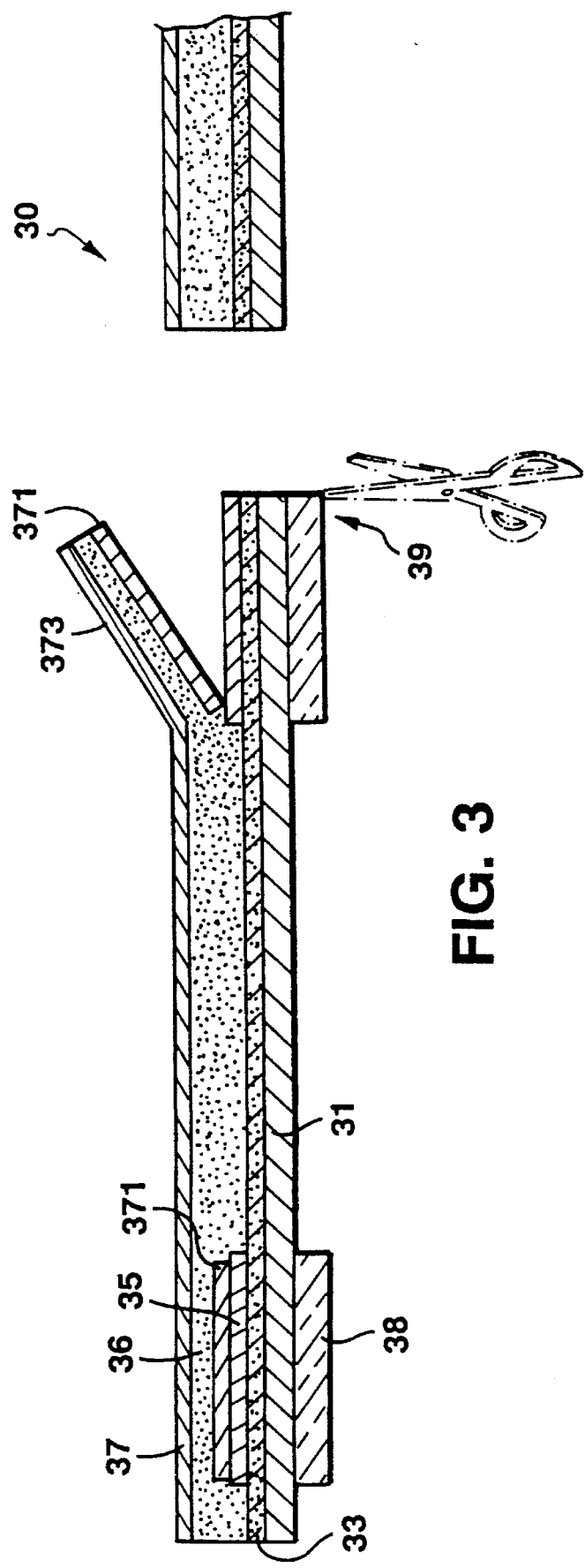
FIG. 3 shows the sectional view of the flat cable according to the second embodiment of the invention.

The second embodiment of the invention, as shown in FIG. 3, comprises a first layer 31 of substrate membrane, a second layer of a plurality of parallel traces 33 for transmitting the signal, a third layer 35 of a plurality of finger arrays and a fourth layer 37 of thin polyester membrane.

The finger array 35 is formed by printing a paste material on the second layer 33. The paste material is obtained by mixing the carbon powder or graphite powder with dielectric resin by a well known manner.

The fourth layer 37 of thin polyester membrane is used to protect the second layer 33 and third layer 35. The well known Mylar material may be used as the thin polyester membrane 37.

The signal transmission flat cable is characterized in that the plurality of finger arrays 35 are provided in the third layer at a plurality of predetermined locations along the flat cable, each of the plurality of finger arrays 35 is spaced from each other by a given distance. A glue material 36 is provided to bond the fourth layer 37 and the second layer 33 along the whole length of the flat cable except at a plurality of predetermined regions which correspond to the finger arrays 35 and where separation sheets 371 are provided for separating the glue material from the finger arrays 35.

Figure 6:
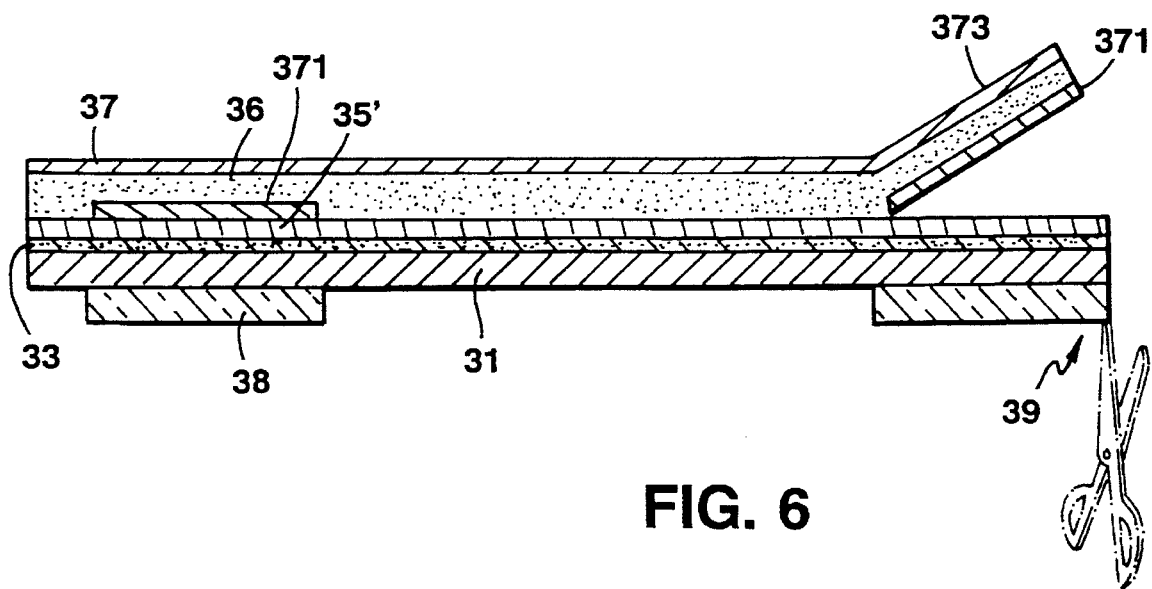
FIG. 6 shows the sectional view of a variant of the second embodiment.

In the variant, the finger array 35'are printed along the whole length of the cable, as shown in FIG. 4(B), FIG. 4(C) and FIG. 6. A glue material 36 is provided to bond the fourth layer 37 and the third layer 35' except at a plurality of predetermined regions where a separation sheet 371 is provided which separates the plurality of predetermined regions of the finger array from contact with the glue material.

Referring again to FIG. 3, before using the invention, the user (computer system manufacturer) first measures the adequate length of the flat cable suitable for insertion into the corresponding socket on the motherboard. Secondly, the user cuts away the excessive portion 30 of the flat cable. Thirdly, flip the portion 373 of the fourth layer 37 which has separation sheet 371 thereon as shown or, alternatively, cut away the portion 373 from the fourth layer 37. The end portion 39 then may be inserted into the corresponding socket on the motherboard.

In order to increase the stiffness of the flat cable, a plurality of reinforced layers 38 are bonded to a bottom surface of the first layer 31 at the locations right under the finger arrays 35.

As a result of the versatility of the invention, the outlet of the flat cable may be located on the left hand corner of the keyboard module, as shown in FIG. 4(A) and FIG. 4(B), or on the central region of the keyboard module, as shown in FIG. 4(C) and FIG. 4(D).

What is claimed is:

1. A signal transmission flat cable comprising:

a first layer of substrate membrane;

a second layer of a plurality of traces for transmitting the signal;

a third layer of a plurality of finger arrays covering on the plurality of parallel traces;

a fourth layer of thin polyester membrane for protecting the second layer and third layer from electrical contact with an unexpected electric device;

the signal transmission flat cable being characterized in that the plurality of finger arrays are provided in the third layer at a plurality of predetermined locations along the flat cable, each of the plurality of finger arrays is spaced from each other by a given distance, and a glue material is provided to bond the fourth layer and the second layer along said given distance.

2. The flat cable recited in claim 1, further comprising:

a plurality of reinforced layers bonded to a bottom surface of the first layer at the locations right under the finger arrays.

3. A signal transmission flat cable comprising:

a first layer of substrate membrane;

a second layer of a plurality of parallel traces for transmitting the signal;

a third layer of a plurality of finger arrays covering the plurality of parallel traces;

a fourth layer of thin polyester membrane protecting the second layer and third layer from electrical contact with an unexpected electric device;

the signal transmission flat cable being characterized in that the plurality of finger arrays are provided in the third layer at a plurality of predetermined locations along the flat cable, each of the plurality of finger arrays is spaced from each other by a given distance, and a glue material is provided to bond the fourth layer and the second layer, and a plurality of separation sheets are provided at the locations corresponding to each of the plurality of finger arrays for separating the finger arrays from contact with the glue material.

4. The flat cable recited in claim 3, further comprising:

a plurality of reinforced layers bonded to a bottom surface of the first layer at the locations right under the finger arrays.

5. A signal transmission flat cable comprising:

a first layer of substrate membrane;

a second layer of a plurality of parallel traces for transmitting the signal;

the signal transmission flat cable being characterized in that a continuous finger array is provided to form a third layer along the flat cable covering the plurality of parallel traces, a fourth layer of thin polyester membrane is provided which protects the third layer from electrical contact with an unexpected electric device and a glue material is provided to bond the fourth layer and the third layer except at a plurality of predetermined regions.

6. A signal transmission flat cable comprising:

a first layer of substrate membrane;

a second layer of a plurality of parallel traces for transmitting the signal;

the signal transmission flat cable being characterized in that a continuous finger array is provided to form a third layer along the flat cable covering the plurality of parallel traces, a fourth layer of thin polyester membrane is provided which protects the third layer from electrical contact with an unexpected electric device and a glue material is provided to bond the fourth layer and the third layer except at a plurality of predetermined regions of the finger array wherein, each region of the finger array is separated from contact with the glue material by a separation sheet.

* * * * *